US010416244B2

(12) United States Patent
Allee et al.

(10) Patent No.: US 10,416,244 B2
(45) Date of Patent: Sep. 17, 2019

(54) THREE-DIMENSIONAL IMAGING UTILIZING LOW FREQUENCY MAGNETIC FIELDS

(71) Applicants: David R. Allee, Phoenix, AZ (US);
Gregory P. Spell, Tucson, AZ (US);
Brett Larsen, Chandler, AZ (US);
Anthony M. Wilson, Tempe, AZ (US);
Owen C. Ma, Phoenix, AZ (US)

(72) Inventors: David R. Allee, Phoenix, AZ (US);
Gregory P. Spell, Tucson, AZ (US);
Brett Larsen, Chandler, AZ (US);
Anthony M. Wilson, Tempe, AZ (US);
Owen C. Ma, Phoenix, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 163 days.

(21) Appl. No.: 15/716,771

(22) Filed: Sep. 27, 2017

(65) Prior Publication Data
US 2018/0088189 A1 Mar. 29, 2018

Related U.S. Application Data
(60) Provisional application No. 62/400,783, filed on Sep. 28, 2016.

(51) Int. Cl.
*G01R 33/06* (2006.01)
*G01R 33/10* (2006.01)
*G01R 33/00* (2006.01)
*G01R 33/07* (2006.01)

(52) U.S. Cl.
CPC ......... *G01R 33/10* (2013.01); *G01R 33/0023* (2013.01); *G01R 33/072* (2013.01)

(58) Field of Classification Search
CPC .... G01R 33/06; G01R 33/10; G01R 33/0023; G01R 33/072; H01F 5/003; G01N 27/725; G01N 27/904; G01N 29/07; G01N 29/11
See application file for complete search history.

(56) References Cited

U.S. PATENT DOCUMENTS

| 6,150,809 | A | 11/2000 | Tiernan et al. |
| 7,902,820 | B2 | 3/2011 | Vervaeke et al. |
| 8,552,721 | B2 | 10/2013 | Peev et al. |

(Continued)

OTHER PUBLICATIONS

Bureau, J. et al., "Advances In Eddy Current Array Sensor Technology", 17th World Conference on Nondestructive Testing (Shanghai, China, Oct. 25-28, 2008), 2008, 4 pages.

(Continued)

*Primary Examiner* — Minh N Tang
(74) *Attorney, Agent, or Firm* — Snell & Wilmer L.L.P.

(57) ABSTRACT

A planar sensor array capable of three-dimensional magnetic field sensing is disclosed. The sensor array may be utilized, for example, in connection with security inspections and detection of concealed electronics and contraband. Each sensor pixel may comprise a planar spiral inductor to measure a magnetic field of interest in a first dimension, a first Hall effect sensor to measure the magnetic field of interest in a second dimension, and a second Hall effect sensor to measure the magnetic field of interest in the third dimension.

16 Claims, 10 Drawing Sheets

(56) References Cited

U.S. PATENT DOCUMENTS

| | | | |
|---|---|---|---|
| 8,704,513 B2* | 4/2014 | Lepage | G01N 27/9033 |
| | | | 324/239 |
| 2005/0012176 A1* | 1/2005 | Arnborg | H01L 27/0617 |
| | | | 257/531 |
| 2010/0072992 A1 | 3/2010 | Bauer | |

OTHER PUBLICATIONS

Carboni, M. et al., "Advanced ultrasonic 'Probability of Detection' curves for designing in-service inspection intervals", International Journal of Fatigue, May 2016 (available online Jul. 2015), vol. 86, pp. 77-87 <DOI:10.1016/j.jfatigue.2015.07.018>.

Cavuto, A. et al., "Experimental investigation by laser ultrasonics for high speed train axle diagnostics", Ultrasonics, Jan. 2015, vol. 55, pp. 48-57 <DOI:10.1016/j.ultras.2014.08.010>.

Chady, T. et al., "Electromagnetic System for Nondestructive Evaluation of Train Hollow Axles", 2013 Far East Forum on Nondestructive Evaluation/Testing: New Technology and Application (Jinan, China, Jun. 17-20, 2013), Date Added to IEEE Xplore: Oct. 2013, pp. 29-34 <DOI:10.1109/FENDT.2013.6635523>.

Chung, H. et al., "A Passive Very Low-Frequency (VLF) Electric Field Imager", IEEE Sensors Journal, May 2016 (Date of Publication: Feb. 16, 2016), vol. 16, No. 9, pp. 3181-3187 <DOI:10.1109/JSEN.2016.2530741>.

Crouch, A. et al., "New method uses conformable array to map external pipeline corrosion", Oil and Gas Journal, Nov. 2004, vol. 102, No. 41, pp. 55-59.

Endo, H. et al., "Signal evaluation system of flexible array ECT probes for inspecting complexly shaped surfaces", AIP Conference Proceedings, Jun. 2011, vol. 1335, pp. 597-603 <DOI:10.1063/1.3591905>.

Estrada, H., "A MEMS-SOI 3D-Magnetic Field Sensor", IEEE 24th International Conference on Micro Electro Mechanical Systems (Cancun, Mexico, Jan. 23-27, 2011), 2011 (Date Added to IEEE Xplore: Mar. 17, 2011), pp. 664-667 <DOI:10.1109/MEMSYS.2011.5734512>.

García-Martín, J. et al., "Non-Destructive Techniques Based on Eddy Current Testing", Sensors, Feb. 2011, vol. 11, pp. 2525-2565 <DOI:10.3390/s110302525>.

Generazio, E., "Electric Potential and Electric Field Imaging with Applications", Materials Evaluation, Nov. 2015, pp. 1479-1489.

Kappes, W. et al., "Potential improvements of the presently applied in-service inspection of wheelset axles", International Journal of Fatigue, May 2016 (available online Aug. 2015), vol. 86, pp. 64-76 <DOI:10.1016/j.jfatigue.2015.08.014>.

Lenz, J. et al., "Magnetic sensors and their applications", IEEE Sensors Journal, Jun. 2006 (Date of Publication: Jun. 5, 2006), vol. 6, No. 3, pp. 631-649 <DOI:10.1109/JSEN.2006.874493>.

Lepage, B. et al., "Development of a flexible cross-wound eddy current array probe", International Journal of Applied Electromagnetics and Mechanics, May 2014, vol. 45, No. 1-4, pp. 633-638 <DOI:10.3233/JAE-141887>.

Li, F. et al., "Guided wave propagation in high-speed train axle and damage detection based on wave mode conversion", Structural Control and Health Monitoring, Feb. 2015, vol. 22, pp. 1133-1147 <DOI:10.1002/stc.1739>.

Lin, J. et al., "Hollow shaft array electromagnetic testing system based on integrated nondestructive testing techniques", Electromagnetic Nondestructive Evaluation (XVIII), 2015, vol. 40, pp. 296-302 <DOI:10.3233/978-1-61499-509-8-296>.

Magcam, "Technology: Magnetic field camera technology" [online], Magcam NV, 2010 [retrieved on Jun. 10, 2016], retrieved from the internet: <URL:http://www.magcam.com/Page-technology-EN.htm>.

Marchand, B. et al., "Development of flexible array eddy current probes for complex geometries and inspection of magnetic parts using magnetic sensors", AIP Conference Proceedings, Jan. 2013, vol. 1151, pp. 488-493 <DOI:10.1063/1.4789087>.

Marty, P. et al., "Latest Development in the UT inspection of train wheels and axles", 18th World Conference on Nondestructive Testing (Durban, South Africa, Apr. 16-20, 2012), 2012, 11 pages.

Mohan, S. et al., "Simple accuracte expressions for planar spiral inductances", IEEE Journal of Solid-State Circuits, Oct. 1999, vol. 34, No. 10, pp. 1419-1424 <DOI:10.1109/4.792620>.

Pacurar, C. et al., "Inductance calculation and layout optimization for planar spiral inductors", 13th International Conference on Optimization of Electrical and Electronic Equipment (Brasov, Romania, May 24-26, 2012), 2012 (Date Added to IEEE Xplore: Jul. 5, 2012), pp. 225-232 <DOI:10.1109/OPTIM.2012.6231846>.

Rudlin, J. et al., "New Methods of Rail Axle Inspection and Assessment", 18th World Conference on Nondestructive Testing (Durban, South Africa, Apr. 16-20, 2012), 2012, 10 pages.

Sheiretov, Y. et al., "TBC Characterization Using Magnetic and Electric Field Sensors", ASME Turbo Expo 2007: Power for Land, Sea, and Air (Montreal, Canada, May 14-17, 2007), 2007, vol. 5, pp. 97-103 <DOI:10.1115/GT2007-27526>.

Sun, Z. et al., "A Flexible Arrayed Eddy Current Sensor for Inspection of Hollow Axle Inner Surfaces", Sensors, Jun. 2016, vol. 16, No. 7, article 952, 9 pages <DOI:10.3390/s16070952>.

Xie, R. et al., "Fatigue Crack Length Sizing Using a Novel Flexible Eddy Current Sensor Array", Sensors, Dec. 2015, vol. 15, No. 12, pp. 32128-32151 <DOI:10.3390/s151229911>.

Ziaja, A. et al., "Cylindrical guided wave approach for damage detection in hollow train axles", 10th International Workshop on Structural Health Monitoring (Stanford, CA, Sep. 1-3, 2015), 2015, pp. 2054-2061 <DOI:10.12783/SHM2015/256>.

Zolog, M. et al., "Characterization of Spiral Planar Inductors Built on Printed Circuit Boards", 30th International Spring Seminar on Electronics Technology (Cluj-Napoca, Romania, May 9-13, 2007), 2007 (Date Added to IEEE Xplore: Jan. 21, 2008), pp. 308-313 <DOI:10.1109/ISSE.2007.4432869>.

\* cited by examiner

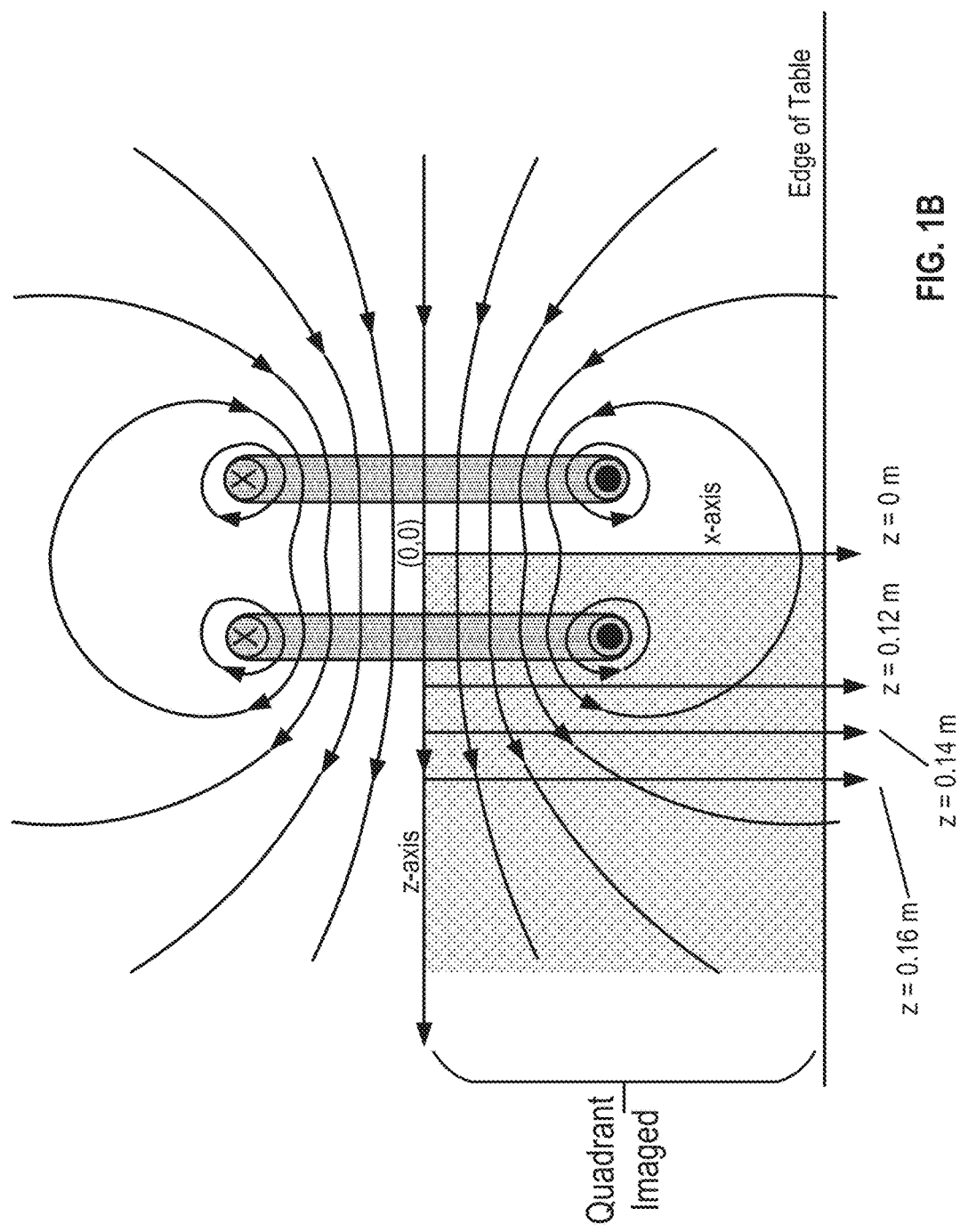

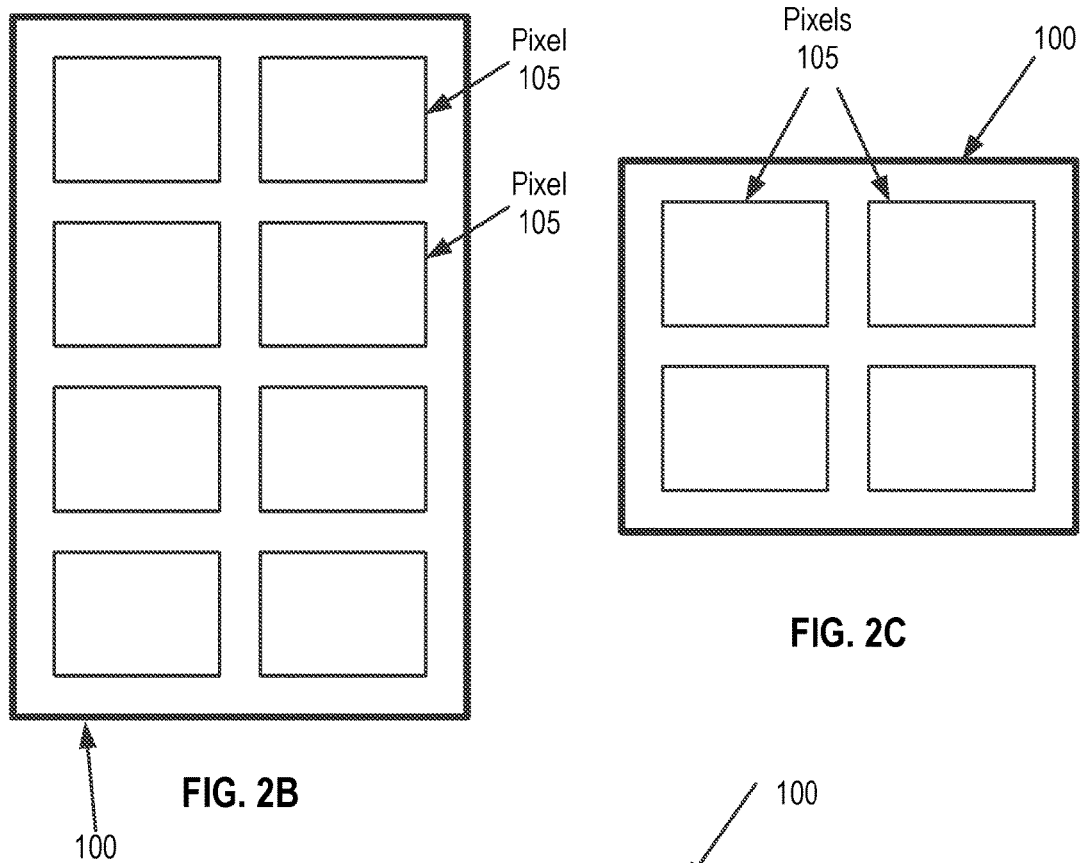
FIG. 2B
FIG. 2C
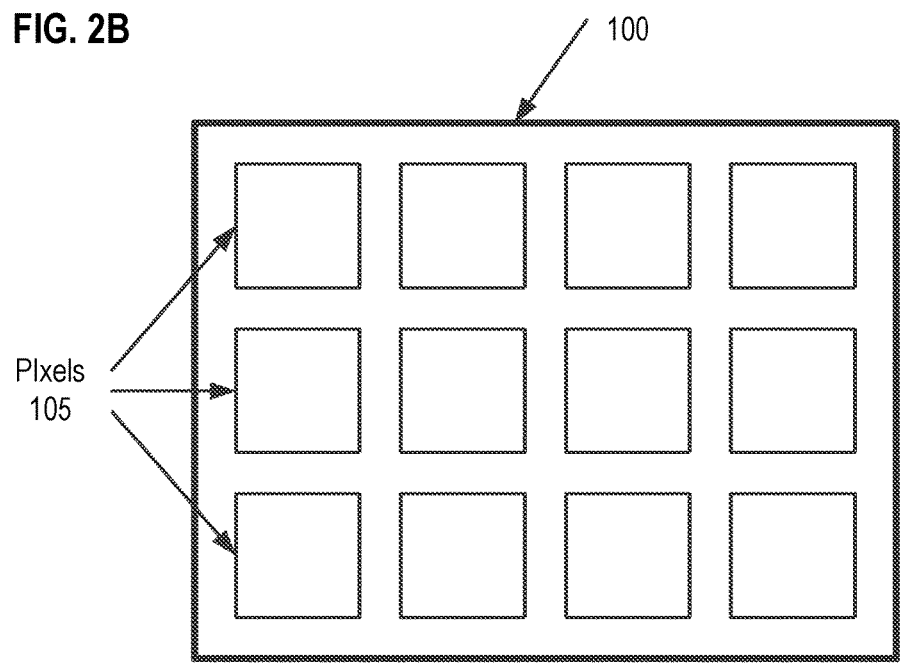
FIG. 2D

Absolute Error Statistics

| $B_z$ | Value |
|---|---|
| Mean | $1.08 \cdot 10^{-2}$ mT |
| Median | $6.75 \cdot 10^{-3}$ mT |
| Standard Deviation | $1.47 \cdot 10^{-2}$ mT |
| Maximum | $8.66 \cdot 10^{-3}$ mT |
| Minimum | $5.05 \cdot 10^{-5}$ mT |

| $B_r$ | Value |
|---|---|
| Mean | $2.01 \cdot 10^{-2}$ mT |
| Median | $4.87 \cdot 10^{-3}$ mT |
| Standard Deviation | $4.04 \cdot 10^{-2}$ mT |
| Maximum | $2.26 \cdot 10^{-1}$ mT |
| Minimum | $7.93 \cdot 10^{-4}$ mT |

FIG. 3C

THREE-DIMENSIONAL IMAGING UTILIZING LOW FREQUENCY MAGNETIC FIELDS

CROSS-REFERENCE TO RELATED APPLICATIONS

This application claims priority to, and the benefit of, U.S. Provisional Application Ser. No. 62/400,783 filed on Sep. 28, 2016 and entitled "SYSTEMS AND METHODS FOR THREE-DIMENSIONAL IMAGING UTILIZING LOW FREQUENCY MAGNETIC FIELDS". The foregoing application is hereby incorporated by reference in its entirety for all purposes.

FEDERALLY SPONSORED RESEARCH OR DEVELOPMENT

This invention was made with government support under Agreement Nos. W911NF-04-2-0005 and W911NF-15-2-0086 awarded by the Army Research Office. The Government has certain rights in the invention.

TECHNICAL FIELD

The present disclosure relates to sensing, and particularly to sensing utilizing magnetic fields.

BACKGROUND

Magnetic field sensing has innumerable applications ranging from digital memory to automotive, aircraft and industrial applications. Accordingly, improved magnetic field sensing approaches remain desirable.

BRIEF DESCRIPTION OF THE DRAWINGS

With reference to the following description and accompanying drawings:

FIG. 1B illustrates characterization of operation of an exemplary system for magnetic imaging in accordance with various exemplary embodiments;

FIGS. 2B, 2C, and 2D illustrate exemplary pixel array configurations in an exemplary magnetic imaging system in accordance with various exemplary embodiments;

FIG. 3C illustrates accuracy information for an exemplary magnetic imaging system in accordance with various exemplary embodiments.

DETAILED DESCRIPTION

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from the scope of the present disclosure.

For the sake of brevity, conventional techniques for magnetic field generation, modulation, and/or sensing, as well as techniques and components of semiconductor circuits, materials systems, and/or the like may not be described in detail herein. Furthermore, the connecting lines shown in various figures contained herein are intended to represent exemplary functional relationships and/or physical or communicative couplings between various elements. It should be noted that many alternative or additional functional relationships may be present in a practical magnetic sensing system and related methods of use.

Magnetic field sensing has innumerable applications ranging from digital memory to automotive, aircraft and industrial applications. Recently, the ability to image very low frequency (VLF) electric fields with an array of sensors has been reported for security inspections and detection of concealed electronics and contraband. However, these arrays image only the perpendicular component of the electric field, and as such are limited in their usefulness.

In contrast, principles of the present disclosure contemplate a planar magnetic field imaging array capable of imaging all 3 components of a magnetic field simultaneously. This capability may also be useful for security and industrial applications. In an exemplary embodiment, operation of an exemplary magnetic imaging system may be demonstrated in connection with imaging the field of a Helmholtz coil, which has well-known analytical expressions for its magnetic field.

Figure 1A:
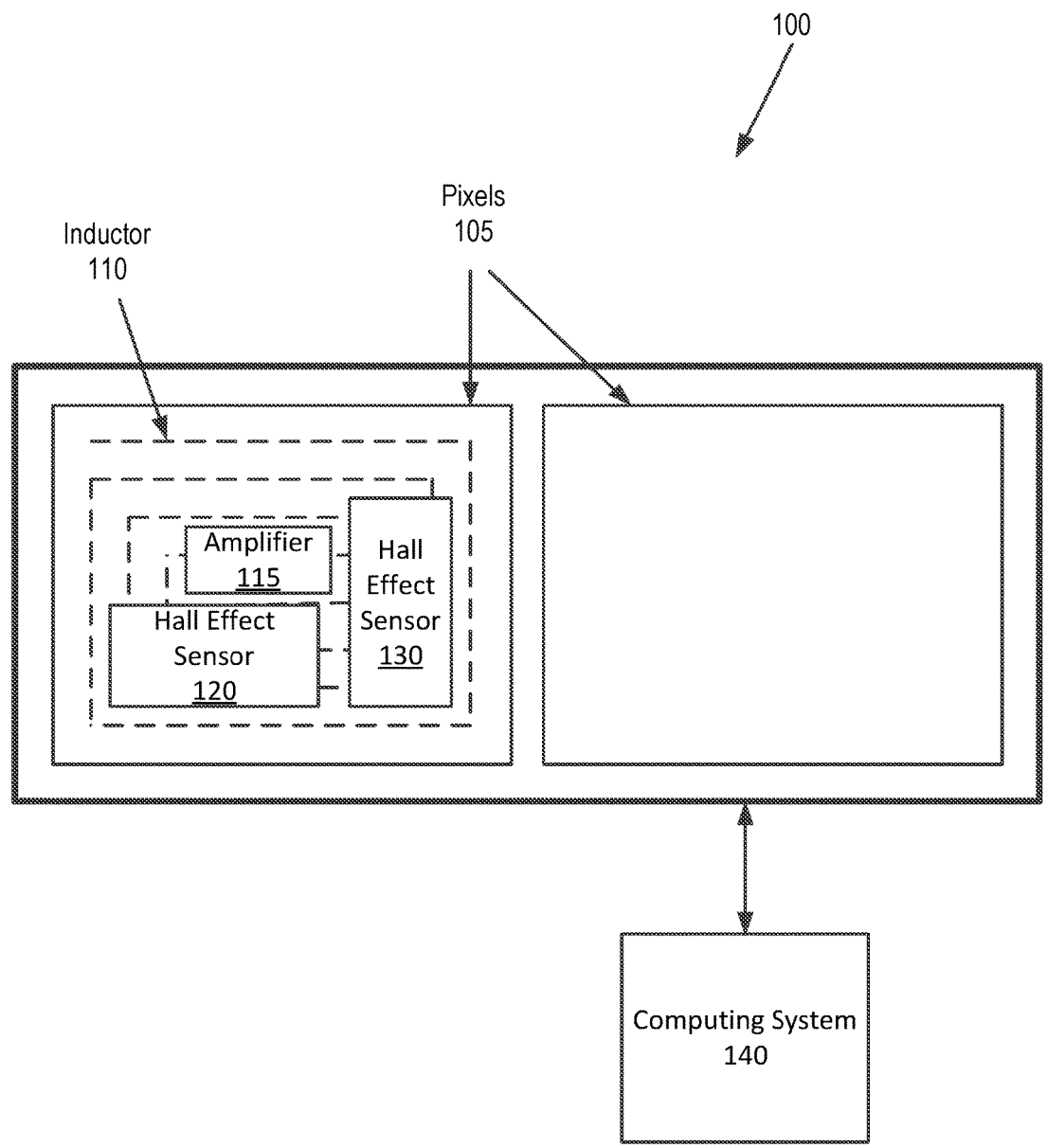
FIG. 1A illustrates an exemplary system for magnetic imaging in accordance with various exemplary embodiments.
Figure 1C:
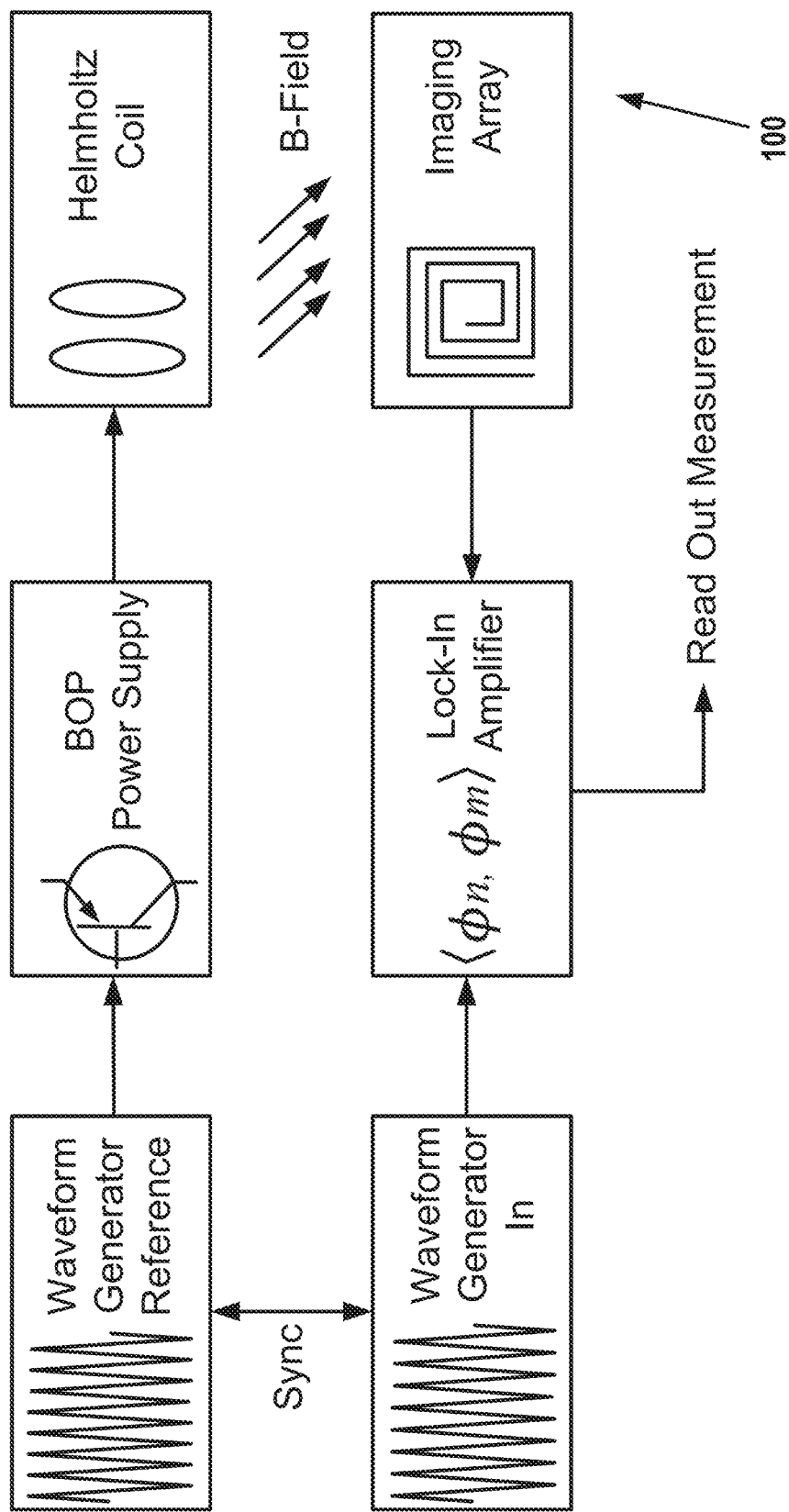
FIG. 1C illustrates an exemplary system for magnetic imaging and components demonstrating operation thereof in accordance with various exemplary embodiments.

With reference now to FIGS. 1A, 1B, and 1C, in various exemplary embodiments a magnetic imaging system 100 may comprise various electronic components and connections as illustrated in FIG. 1A. For example, in one exemplary embodiment magnetic imaging system 100 comprises one or more pixels 105; each pixel 105 comprises an inductor 110, a first Hall effect sensor 120, and a second Hall effect sensor 130. In operation, planar spiral inductor 110 measures a magnetic field of interest in a first dimension, first Hall effect sensor 120 measures the magnetic field of interest in a second dimension, and second Hall effect sensor 130 measures the magnetic field of interest in the third and final dimension, thus providing true three-dimensional imaging of the magnetic field of interest. Measurements and control may be provided, for example, via a coupled computing system 140.

In various exemplary embodiments, each pixel 105 of an exemplary low-cost imaging array in magnetic imaging system 100 may be built around an inductor 110 configured as a planar spiral, long used in RF circuit technology. A planar spiral inductor is a concentric coil of wire in the plane of the board whose inductance can be used to measure magnetic flux normal to the board. The properties of these sensors have been studied extensively both on silicon and on PCB's. Inductance and bandwidth are primarily determined by the width of the trace, the area of the sensor, the distance between traces, the number of turns in the coil, and the shape of the coil. Other suitable pixel constructions may be utilized, as desired.

In various exemplary embodiments, a lumped circuit model may be utilized to optimize a design for inductance in the low-frequency regime, and a square planar spiral design for inductor 110 may be utilized to maximize the use of the area in each pixel 105. However, any suitable shape for inductor 110 may be utilized. In one embodiment, inductor 110 is routed onto the back layer of a PCB and wound as tightly as possible using the minimum allowable trace spacing and width for particular manufacturing specifications, for example 6 mils, within an area of 4 cm$^2$.

In an exemplary embodiment, to enable three-dimensional imaging, two Hall effect sensors 120, 130 may be placed orthogonally to one another on the other side of a PCB having planar spiral inductor 110 thereon (for example, Melexis IC's, MLX91205). Hall effect sensors measure the magnetic field across them by outputting the voltage generated by the magnetic force on the current flowing through a piece of silicon. By reading off these two sensors, magnetic imaging system 100 can measure the magnetic field in the plane of the board and combine this with the measurement normal to the board from inductor 110.

Each pixel 105 also contains pre-amplification, as one of the main challenges in low-frequency magnetic field sensing is isolating the weak signals generated by the field from the noise generated by the environment and on-board circuitry. By placing the pre-amplifiers on-board within the pixels 105, exemplary systems and methods avoid the risk of distorting the signal as it is routed off chip to a lock-in amplifier. In one exemplary embodiment, each amplifier 115 is an OP27 operational amplifier (offered by Analog Devices of Norwood, Mass.) configured as a difference amplifier, but the gain applied to inductor 110 output and Hall effect sensor 120, 130 outputs is not the same due to the fact the latter is already amplified, though not significantly. Other suitable amplifiers may be utilized, as desired.

Figure 2A:
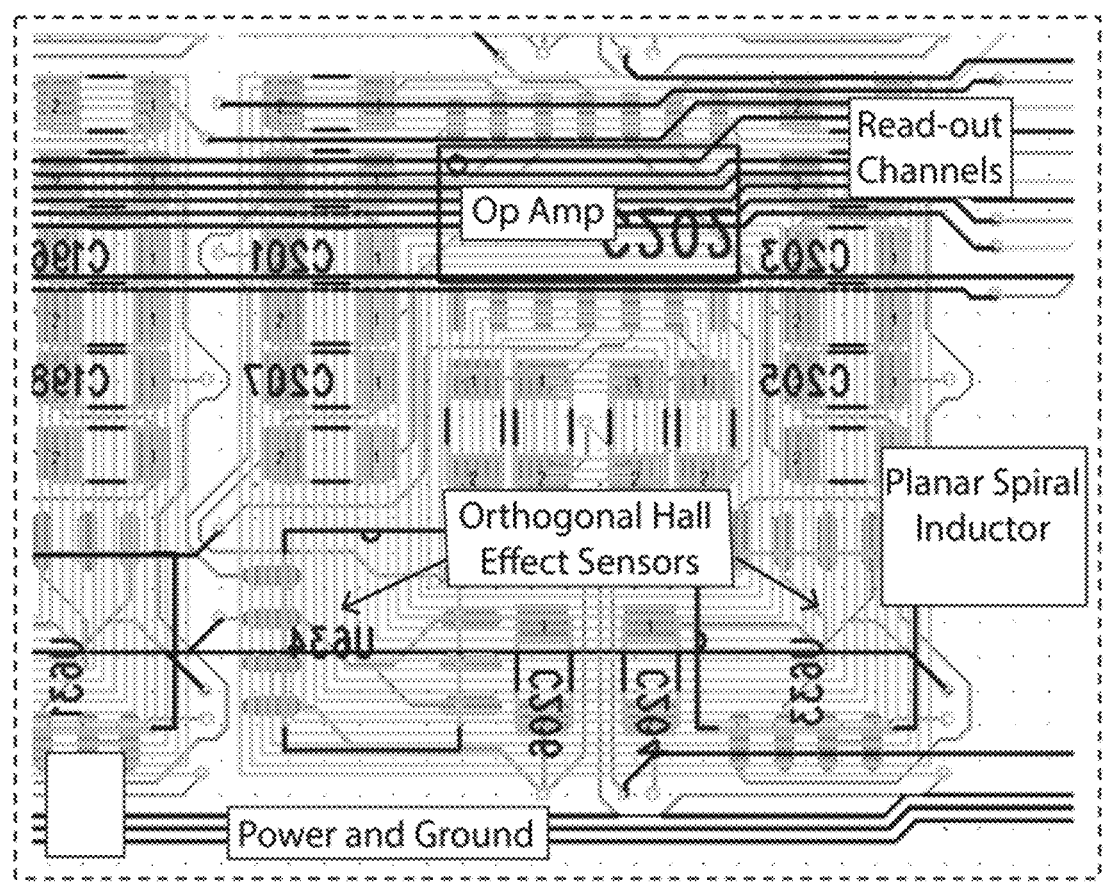
FIG. 2A illustrates a pixel of an exemplary magnetic imaging system array in accordance with various exemplary embodiments.

In one exemplary embodiment, inductor 110 and Hall effect sensor 120, 130 signals are nominally amplified at 100 V/V and 10 V/V respectively. FIG. 2A shows the layout of a single exemplary pixel 105 on an exemplary printed circuit board. With momentary reference to FIGS. 2B, 2C, and 2D, in one exemplary embodiment, magnetic imaging system 100 may utilize a 2×8 pixel 105 array, but other arrays may be utilized, for example 4×4, 2×16, 4×16, 8×8, and/or the like.

Operational Procedure:

FIG. 1A illustrates a testing set-up for an exemplary magnetic imaging system, for example magnetic imaging system 100. A Kepco BOP (bipolar output) power supply, acting as a voltage controlled current source, may be utilized to power the coils. For certain exemplary embodiments, a sinusoidal voltage fixed at 97 Hz feeds into the power supply, and any DC current may be zeroed out as closely as possible. Outputs of the difference amplifiers for each pixel 105 may be fed to a lock-in amplifier with a reference signal of 97 Hz.

Figure 2E:
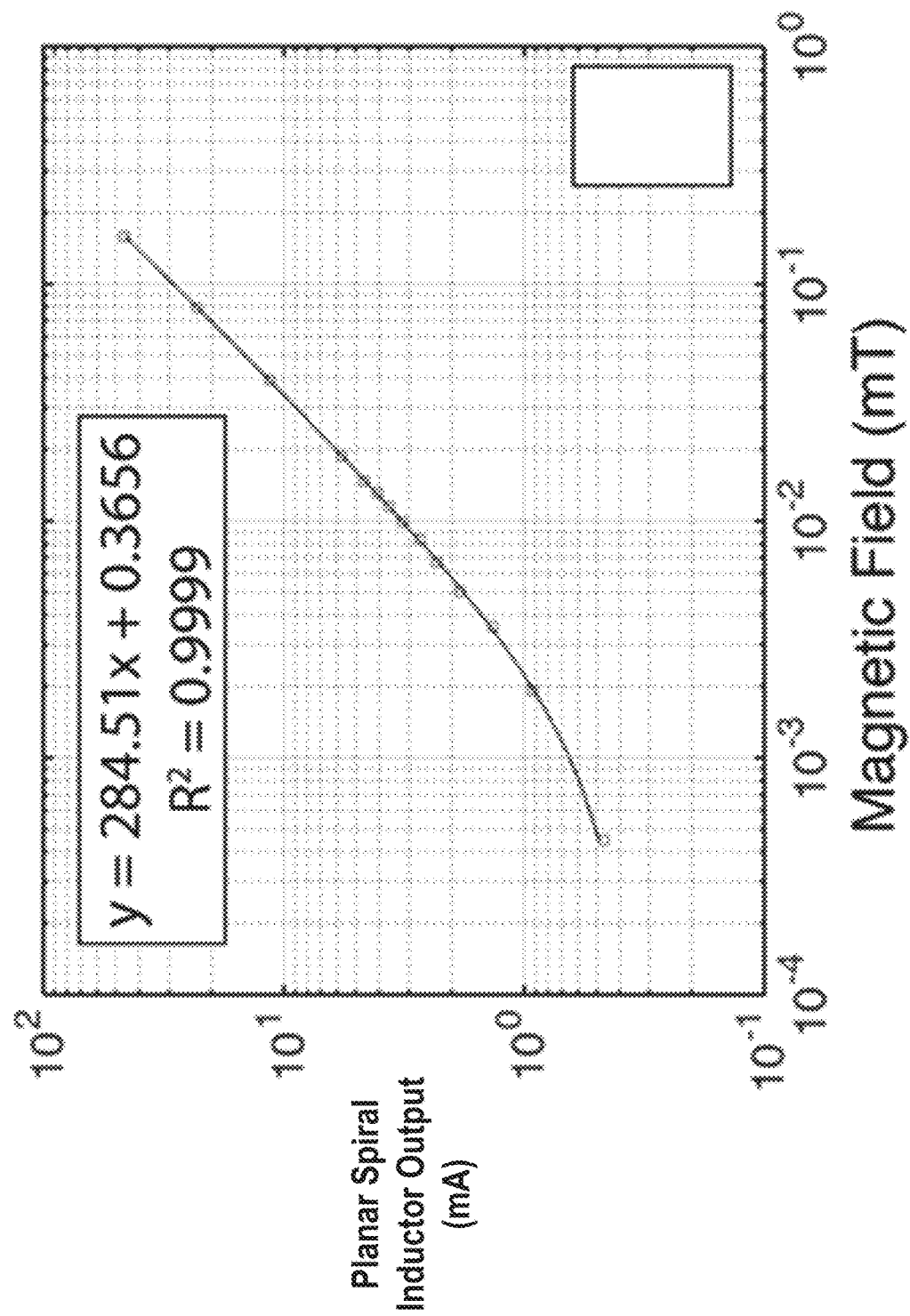
FIG. 2E illustrates characterization of an exemplary planar spiral inductor in a pixel of an exemplary magnetic imaging system in accordance with various exemplary embodiments.
Figure 2F:
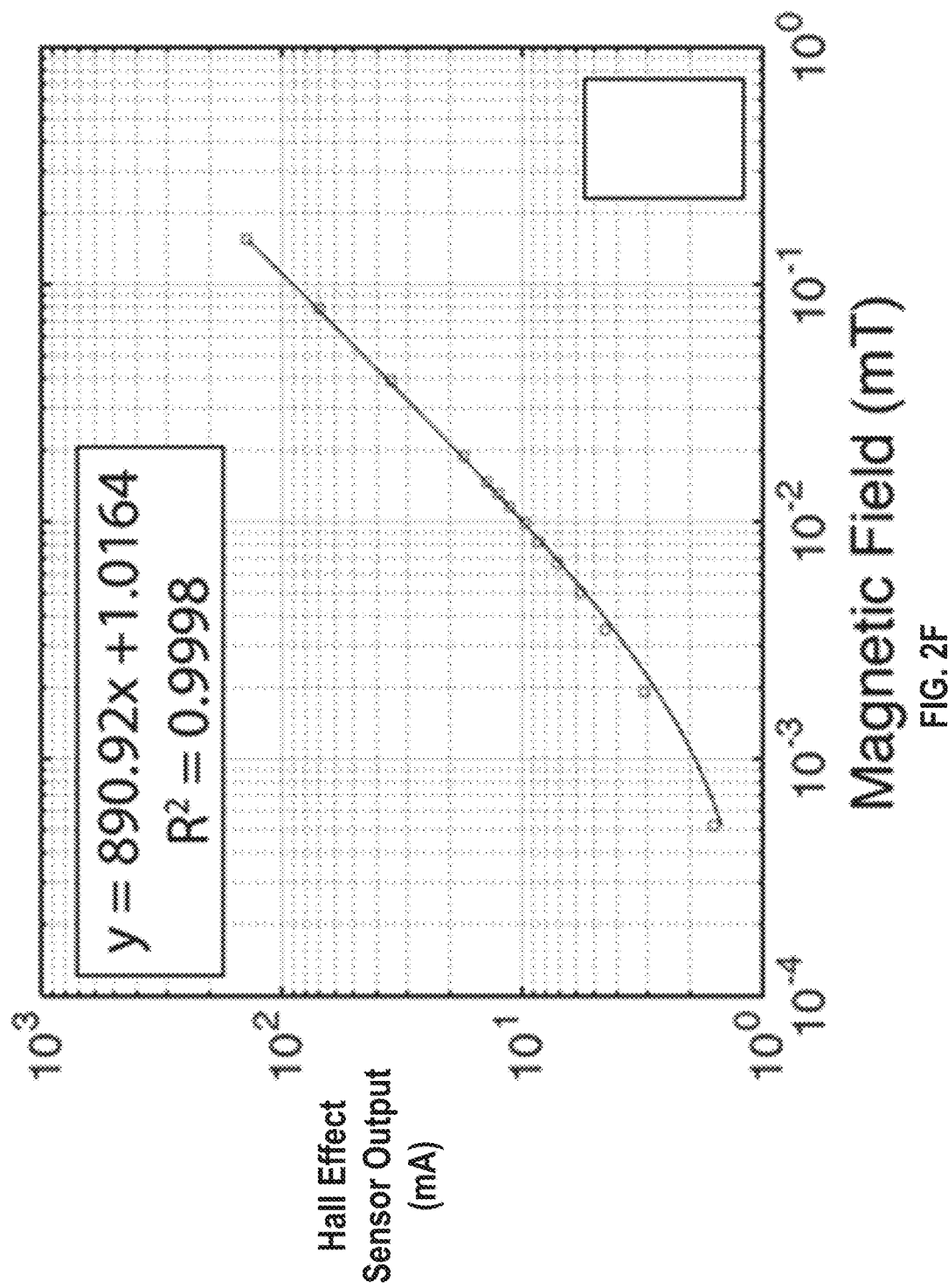
FIG. 2F illustrates characterization of an exemplary Hall effect sensor in a pixel of an exemplary magnetic imaging system in accordance with various exemplary embodiments.

Sensor Characterization:

In an exemplary embodiment, the response of the pixel 105 sensors in magnetic imaging system 100 may be characterized using a known magnetic field. An exemplary pixel 105 may be placed between the coils, level with the center of the coils and fixed so that the sensitive direction of the component being tested lies along the coil axis. The sinusoidal magnetic field produced at the center of the Helmholtz coil may be varied in amplitude from approximately 0.160 mT to $10^{-3}$ mT, recording the lock-in amplifier output at each step. In one characterization approach, two trials were recorded: one in which inductor 110 is measuring along the coil axis, and another with a Hall effect sensor 120 and/or 130 measuring the same component. The results are shown in FIG. 2E and FIG. 2F respectively. These exemplary operations demonstrate that the sensing capabilities of pixel 105 are linear in a range of interest and that both inductor 110 and Hall effect sensors 120, 130 are able to detect magnetic fields down to at least $10^{-3}$ mT.

Helmholtz Coil Imaging:

As shown in FIG. 1B, the field of an exemplary Helmholtz coil is symmetric in the four quadrants drawn from the center point between the coils. Furthermore, the field has cylindrical symmetry, and thus, to characterize operation of magnetic imaging system 100, measurements of the axial (along the z-axis) and radial (vector sum of $B_x$ and $B_y$) fields may be made in the shaded quadrant of FIG. 1B. For each measurement, a pixel 105 is oriented such that the open face of inductor 110 is measuring in the x-direction, and the pixel 105 center point is level with the Helmholtz coil axis. Input voltage from the signal generator is kept constant at 1 $V_{pp}$, resulting in approximately a 200 $mA_{rms}$ sinusoidal current into the coils. For each set of coordinates considered, the lock-in amplifier reading of each sensor in pixel 105 is recorded, and the pixel 105 is then shifted to another location.

Figure 3A:
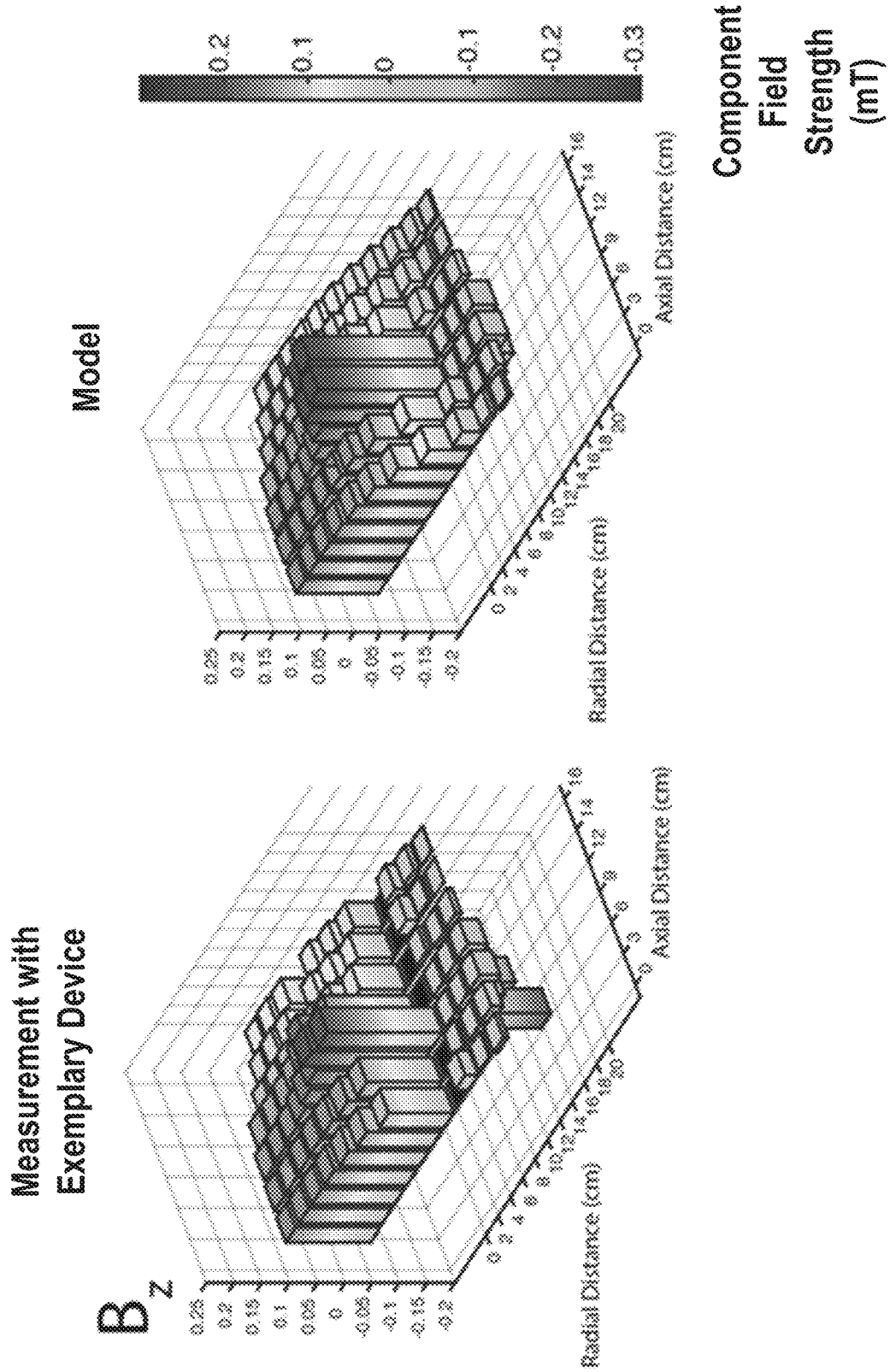
FIG. 3A illustrates operational results of an exemplary magnetic imaging system for a known axial component of a magnetic field, contrasted with modeled expected results, in accordance with various exemplary embodiments.
Figure 3B:
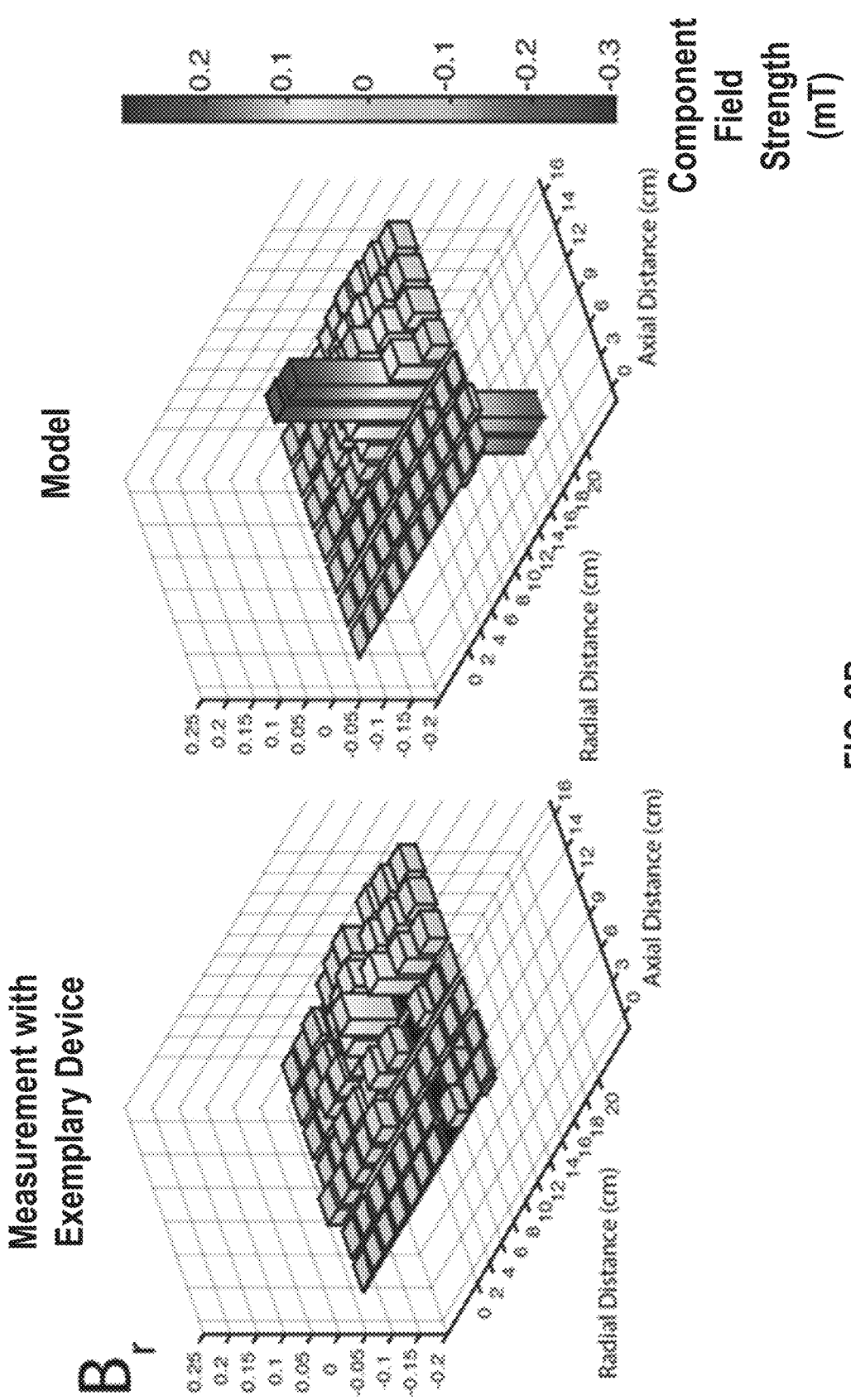
FIG. 3B illustrates operational results of an exemplary magnetic imaging system for a known radial component of a magnetic field, contrasted with modeled expected results, in accordance with various exemplary embodiments.

Results:

FIGS. 3A and 3B illustrate operational measurements from an exemplary magnetic imaging system 100 of an exemplary axial and radial field, alongside theoretical values generated by the well-known analytical expressions for the Helmholtz coil field. To give a sense of where the measurements are located in the quadrant, FIG. 1B shows approximately where some of the axial distances are located (not to scale), the radial distance may be varied by moving pixels 105 along these lines. At 0.14 m in radial distance, many of the measurements are set to zero; this is because these points were not accessible to measure due to the obstruction of the Helmholtz coil itself.

In various exemplary embodiments, operation of magnetic imaging system 100 may be characterized in terms of absolute error. Absolute error may be selected as a suitable measure of the efficacy of an exemplary magnetic imaging system 100, because many of the field values may be close to zero, distorting measurements of relative error. In one embodiment, absolute error was calculated at each point measured for the axial field and radial field and the statistics for these errors are shown in FIG. 3C. Overall, an exemplary pixel 105 of magnetic imaging system 100 was shown to be effective at imaging three-dimensional magnetic fields with average errors on the order of $10^{-2}$ mT for both the axial field and radial field.

Principles of the present disclosure demonstrate magnetic field imaging of all 3 magnetic field components with a planar array of sensors. While an exemplary embodiment of magnetic imaging system 100 is configured with a sensing array of 2×8 pixels 105, the design is readily scalable to an arbitrarily large size, and may be implemented on a flexible substrate to form a magnetic field imaging blanket.

In addition to the foregoing applications, exemplary systems and methods disclosed herein may be combined with D-dot electric field imaging arrays, for example as disclosed in the article "A Passive Very Low-Frequency (VLF) Electric Field Imager" in *IEEE Sensors Journal*, vol. 16, issue 9, pp. 3181-3187 (the contents of which are hereby incorporated by reference in their entirety) for complete VLF electric and magnetic field imaging. In certain embodiments, external lock-in capabilities can be miniaturized with appropriate components for a fully portable, low space, weight and power instrument.

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure and may be expressed in the following claims.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element of any or all the claims.

As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. When language similar to "at least one of A, B, or C" or "at least one of A, B, and C" is used in the claims or specification, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

What is claimed is:

1. A system for three-dimensional imaging of a magnetic field, the system comprising:
    a plurality of sensor pixels arranged in a planar grid, each sensor pixel comprising:
        a planar spiral inductor disposed on a first side of a printed circuit board;
        a first Hall effect sensor disposed on a second side of the printed circuit board opposite the first side; and
        a second Hall effect sensor disposed on the second side of the printed circuit board and orthogonal to the first Hall effect sensor.

2. The system of claim 1, wherein the plurality of sensor pixels is configured as a 2×8 array.

3. The system of claim 1, wherein each sensor pixel in the planar grid of sensor pixels further comprises an operational amplifier coupled to the planar spiral inductor, the first Hall effect sensor, and the second Hall effect sensor.

4. The system of claim 3, wherein the operational amplifier amplifies a signal from the planar spiral inductor by a first magnitude, and wherein the operational amplifier amplifies a signal from the first Hall effect sensor and a signal from the second Hall effect sensor by a second magnitude smaller than the first magnitude.

5. The system of claim 4, wherein the first magnitude is 100 volts/volt (V/V) and the second magnitude is 10 V/V.

6. The system of claim 1, further comprising a computing device coupled to each sensor pixel in the planar grid, the computing device configured to record the output of each sensor pixel during operation of the system.

7. The system of claim 1, wherein the first Hall effect sensor and the second Hall effect sensor comprise identical electronic components.

8. The system of claim 1, wherein the planar spiral inductor is configured in a rectangular shape.

9. A method for three-dimensional imaging of a magnetic field, the method comprising:
    placing a planar array of sensor pixels in a first position; and
    moving the planar array between the first position and a second position to image the magnetic field in a three-dimensional space between the first position and the second position,
    wherein each sensor pixel in the planar array of sensor pixels comprises:
        a planar spiral inductor disposed on a first side of a substrate;
        a first Hall effect sensor disposed on a second side of the substrate opposite the first side; and
        a second Hall effect sensor disposed on the second side of the substrate.

10. The method of claim 9, wherein, during operation of a sensor pixel, the inductance of the planar spiral inductor is utilized to measure magnetic flux normal to the planar spiral inductor.

11. The method of claim 10, wherein, during operation of a sensor pixel, the first Hall effect sensor and the second Hall effect sensor are utilized to measure magnetic flux in the plane of the sensor pixel.

12. The method of claim 11, wherein each sensor pixel in the planar array of sensor pixels further comprises an operational amplifier coupled to the planar spiral inductor, the first Hall effect sensor, and the second Hall effect sensor.

13. The method of claim 12, wherein, during operation of a sensor pixel:
    the operational amplifier amplifies a signal from the planar spiral inductor by a first magnitude; and
    the operational amplifier amplifies a signal from the first Hall effect sensor and a signal from the second Hall effect sensor by a second magnitude smaller than the first magnitude.

14. The method of claim 9, wherein the moving the planar array between the first position and the second position comprises:
    taking a reading from each sensor pixel in the planar array of sensor pixels at the first position;
    taking a reading from each sensor pixel in the planar array of sensor pixels at one or more intermediary positions between the first position and the second position; and
    taking a reading from each sensor pixel in the planar array of sensor pixels at the second position.

15. The method of claim 9, wherein each sensor pixel is capable of detecting a magnetic field as small as $10^{-3}$ mT.

16. The method of claim 9, wherein, during the moving the planar array between the first position and the second position, the output of each sensor pixel is recorded by a computing device.

* * * * *